United States Patent [19]

Leland et al.

[11] 4,403,348
[45] Sep. 6, 1983

[54] SINGLE SIDEBAND RECEIVER WITH INTERSYLLABIC GAIN CORRECTION LIMIT CONTROL

[75] Inventors: Kenneth W. Leland, Howell; Nelson R. Sollenberger, Ocean, both of N.J.

[73] Assignee: Bell Telephone Laboratories, Incorporated, Murray Hill, N.J.

[21] Appl. No.: 304,206

[22] Filed: Sep. 21, 1981

[51] Int. Cl.³ .......................... H04B 1/68; H04B 1/16
[52] U.S. Cl. ..................................... 455/203; 455/239; 455/245; 455/250; 179/1 VL
[58] Field of Search ..................... 455/47, 52, 65, 136, 455/138, 203, 233, 235, 239, 240, 245, 246, 250, 308, 309, 202, 219; 179/1 VL

[56] References Cited

U.S. PATENT DOCUMENTS

| | | | |
|---|---|---|---|
| 2,179,928 | 11/1939 | Hagenhaus | 455/245 |
| 2,783,372 | 2/1957 | Peterson et al. | 455/203 |
| 4,013,964 | 3/1977 | Skutta | 455/245 |
| 4,121,161 | 10/1978 | Ohsawa | 455/246 |
| 4,204,172 | 5/1980 | Sadou et al. | 455/203 |
| 4,313,211 | 1/1982 | Leland | 455/203 |
| 4,328,590 | 5/1982 | Lee | 455/308 |

OTHER PUBLICATIONS

"Microwave Mobile Communications" Edited by Jakes, Jr., 1974, Sec. 4-1.7, Comparison with SSB and FM, pp. 201-207.
"Impairment Mechanisms for SSB Mobile Communications at UHF with Pilot-Based Doppler/Fading Correction" by Leland et al., Bell System Technical Journal, vol. 59, No. 10, Dec. 1980.

Primary Examiner—Jin F. Ng
Attorney, Agent, or Firm—C. S. Phelan

[57] ABSTRACT

In a single sideband radio receiver utilizing a limited, pilot-controlled, gain correction arrangement (38) to compensate for radio channel fading, a signal (RECT CAP) representing receiver audio output level is utilized (97) during intersyllabic quiet intervals to increase the limiting threshold on the gain correction signal to suppress noise and interference.

13 Claims, 3 Drawing Figures

SINGLE SIDEBAND RECEIVER WITH INTERSYLLABIC GAIN CORRECTION LIMIT CONTROL

BACKGROUND OF THE INVENTION

This invention relates to single sideband radio receivers, and it relates more particularly to such receivers which are useful for mobile radiotelephone service.

Mobile radiotelephone signals are subject to rapid deep fading due to the multipath environment in which they are utilized. This is particularly true of such signals when transmissions are at frequencies in the microwave spectrum, i.e., from about 450 megahertz (MHz) up to 10 or 20 gigahertz (GHz). The problem is acute in single sideband (SSB) transmissions because they rely on amplitude variations for conveying information.

Feed forward gain correction affords some relief because it allows the correction to be effected in a timely phase-aligned fashion. The term "feed forward gain correction" here refers to the derivation from the radio channel of a signal to control automatic adjustment of the gain through a part of the receiver downstream, in a signal flow sense, from the point of control signal derivation to modify information signal amplitude in a direction tending to offset the effects of fading experienced in the radio channel. The offset is intended to restore signals to a level that conforms to a predetermined transmission level plan for the radiotelephone system. One example of feed forward gain correction in a single sideband receiver is found in the copending application of K. W. Leland, Ser. No. 065957, filed Aug. 13, 1979, entitled "Single Sideband Receiver with Pilot-Based Feed Forward Correction for Motion-Induced Distortion" now U.S. Pat. No. 4,313,211, and which application is assigned to the same assignee as the present application. In that Leland application, the use of companding was contemplated for suppressing to some extent the noise effects that become noticeable during quiet intervals in speech.

The concept of limiting gain correction was mentioned by M. J. Gans and Y. S. Yeh at page 206 (without disclosed implementation) in *Microwave Mobile Communications*, edited by W. C. Jakes and published in 1974 by John Wiley and Sons. Gain limiting was achieved in the Leland application by limiting excursions from a predetermined normal pilot signal level in order to prevent large signal level excursions in the audio output that result from quasi-infinite corrections that may otherwise occur when a pilot signal used for control of gain correction fades to a near-zero amplitude level. Such excursions have been found to be annoying to radiotelephone listeners. The limiting effect represented only a small departure from the transmission system level plan and was effective during only deep fade times.

Nevertheless, difficulties persist in that limited, but still large, correction signals occurring during a period of quiet audio can cause annoying enhancement of noise and cochannel interference which appear during a fade on the desired signal which is being corrected. Prior attempts to resolve this problem for a slowly fading channel have involved the utilization of a function of the audio output in a feedback automatic gain control (AGC) operation to mute the receiver or otherwise temper the impact of the quiet time noise. Several examples are found in patents such as the K. Hagenhaus U.S. Pat. No. 2,179,928, the F. R. Skutta U.S. Pat. No. 4,013,964, the M. Ohsawa U.S. Pat. No. 4,121,161, and the J. Ben Sadou et al. U.S. Pat. No. 4,204,172. A common characteristic of these four references is that the gain control does not respond to the rapid fading experienced at microwave frequencies.

SUMMARY OF THE INVENTION

The foregoing problem is alleviated in an illustrative embodiment of the present invention by using a function of a receiver audio frequency information signal during an audio quiet interval to inhibit, at least partially, a gain correction operation in the receiver.

The effect of the foregoing is to allow the quiet interval noise and cochannel interference which occur during a deep fade to be subjected to somewhat less correction than normal for such a fade (so they are more suppressed). At the same time, the quiet interval inhibiting of correction works no substantial reduction in average output volume of the receiver for the desired signal, since gain is inhibited only during fades; and fades are usually of short duration. In an illustrative embodiment, the inhibiting is implemented by increasing a correction limit threshold which reduces the gain during fades. That increase lowers what is sometimes called the "signal-to-interference disadvantage," i.e., the increase in noise due to the gain correction process. The enlarged threshold represents a temporary substantial departure from the system transmission level plan, but it is effective primarily during intersyllabic quiet times; so it does not affect the desired signal level substantially.

BRIEF DESCRIPTION OF THE DRAWING

A more complete understanding of the invention and its various features, objects, and advantages may be obtained from a consideration of the following Detailed Description taken in connection with the appended claims and the attached drawing, in which

DETAILED DESCRIPTION

Figure 1:
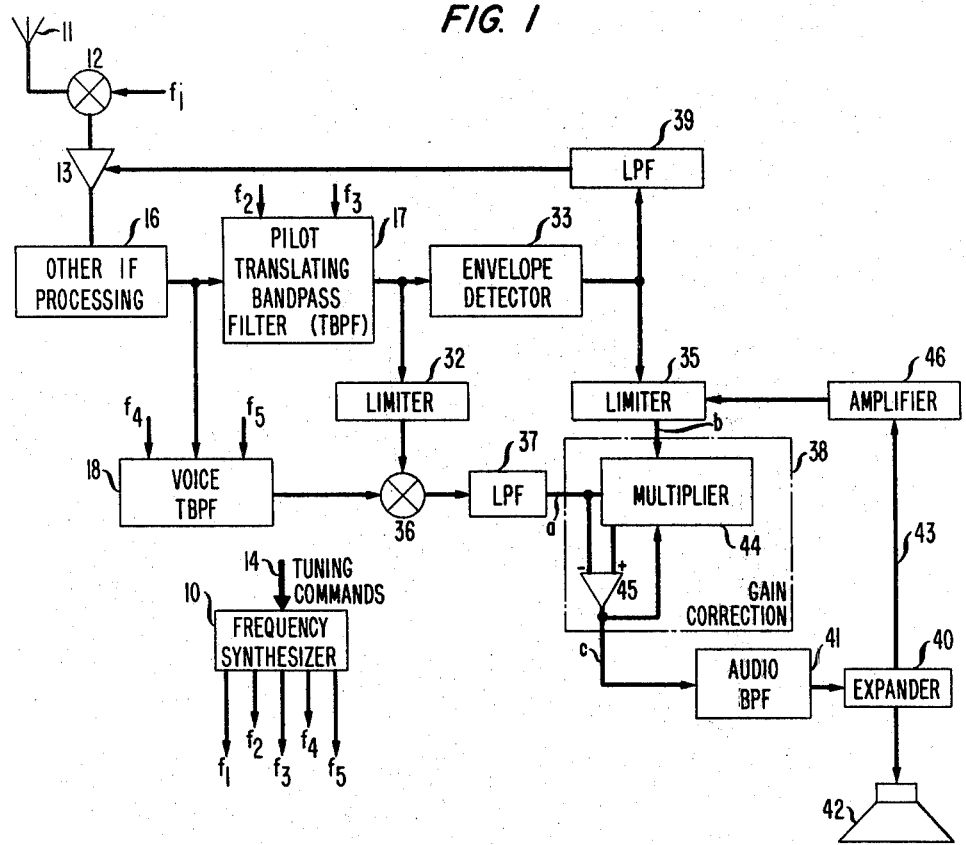
FIG. 1 is a block and line diagram of an SSB receiver utilizing the present invention.

FIG. 1 illustrates an SSB receiver of the type in FIG. 1 of the aforementioned Leland application, but modified in accordance with the present invention, as will be hereinafter described. Common elements are designated in FIG. 1 herein with the same reference characters utilized in that Leland application. The descriptive material for the receiver in the Leland application is hereby incorporated herein by reference. For the convenience of the reader, however, a summary description of the basic receiver is presented herein to facilitate an understanding of the modification thereto represented by the present invention.

In FIG. 1, a frequency synthesizer 10 supplies various signals of different frequencies which are used to control frequency translation and filtering functions in other parts of the single sideband receiver of FIG. 1. Illustrative output leads of the synthesizer 10 are designated by the subscripted reference character f to represent the different frequencies. Similar reference characters are applied to other leads in the receiver where the respective synthesizer output signals are applied. The synthesizer receives tuning commands by way of data circuits 14 from an appropriate data signal source (not separately shown).

Radio signals are received at an antenna 11 and include signals for multiple communication channels, each including in SSB suppressed carrier form at least an information frequency component, e.g., voice or data signals, and a pilot frequency component in some predetermined spectral position in relation to the band of the information component. For example, and to facilitate discussion of an illustrative embodiment, there will be hereinafter assumed a communication channel that is 5 KHz in width. A pilot signal is located at 200 Hz above the low frequency edge of the channel, and voice signals are located in a band extending from 800 Hz to 3500 Hz above the low frequency edge of the channel corresponding to the audio frequencies of 300 to 3000 Hz translated to RF.

In land mobile radiotelephone systems, especially those operating in the microwave frequency range, the received radio signals include both rapid deep fading, which is typical of Rayleigh fading in the mobile radiotelephone multipath environment, and rapidly varying frequencies, which are typical of the Doppler frequency spread effect in that multipath environment. The usual radio channel noise and cochannel interference are also present.

Signals received at the antenna 11 are translated to an intermediate frequency (IF) range in a mixer such as the balanced mixer 12 in FIG. 1. Mixer 12 also receives the signal $f_1$ from the frequency synthesizer 10. The signal $f_1$ has a frequency which is selected, for the particular channel to be processed in the receiver, to translate that channel to a nominal IF such as 10 MHz. That translated If signal still includes the aforementioned fading and frequency spread distortion effects.

The output of mixer 12 is applied to an amplifier 13 where it is subjected to typical slow AGC feedback correction for the usual slow gain effects such as are caused by changing mobile unit distance from a station, shadowing with respect to a transmitting station, and the like. The output of amplifier 13 is then coupled through miscellaneous other IF signal processing circuits well known in the art, e.g., for band limiting of the IF signal to a band including primarily the desired channel and also including at least a part of the channels on either side in the spectrum. Such processing circuits are schematically represented by the circuit 16 in the drawing.

IF signals from the processing circuit 16 are then applied in parallel to two translating bandpass filters (TBPF) 17 and 18. These filters are advantageously direct conversion circuits of a type sometimes characterized as a Weaver circuit, i.e., the true-and-quadrature-channel type circuit of the D. K. Weaver U.S. Pat. No. 2,928,055. These circuits translate a desired signal band between different frequency levels and/or effect bandpass filtering at the same time that the signal band is coupled through the TBPF.

The pilot TBPF 17 is operated to select from the received intermediate frequency band the pilot signal component for a predetermined information communication channel with all of the fading and frequency spreading effects and pilot cochannel interference to which that channel had been subjected in transmission to the antenna 11. The TBPF 17 employs an input passband center frequency reference $f_2$, otherwise sometimes called the pilot frequency reference; and pilot TBPF 17 also uses an output passband center frequency reference $f_3$, sometimes called the voice suppressed carrier frequency reference. Thus, the output of TBPF 17 illustratively includes substantially only a predetermined pilot frequency band at the IF level without significant information band energy. This output of course still includes all of the slow and fast fading effects and pilot cochannel interference associated with signals received at the antenna 11. The output of TBPF 17 is applied in parallel to the input of a limiter circuit 32, to derive the frequency spreading phase corruption information without the fading corruption information, and to the input of an envelope detector circuit 33 that derives the fast and slow fading corruption information without the frequency spread phase corruption information.

The removal of amplitude information is advantageously accomplished here in the limiter circuit 32. The limited signals are applied as the reference frequency input to a balanced mixer 36 which also receives the output of the voice TBPF 18.

The voice TBPF 18 utilizes an input passband center frequency $f_4$, otherwise sometimes designated the voice channel center frequency reference. In this particular illustrative embodiment, the output passband center frequency reference $f_5$ is at the same frequency as the input reference $f_4$, since the TBPF 18 is here utilized as a convenient and easily controllable filtering device for selecting the predetermined voice channel from other frequencies which may appear in the output of the processing circuit 16 and, in particular, separating the information, or voice, frequency spectrum of the channel from any adjacent pilot frequency and other channel pilots and voice signals to the extent that previous IF filtering is incomplete.

The TBPF 18 includes delays in its information signal transmission paths to match its delay with respect to that through the TBPF 17 and limiter 32. The output of TBPF 18 includes essentially only the aforementioned voice frequency band at the IF level including the fading and Doppler frequency spread distortions and the cochannel interference that were present in signals received at antenna 11.

Mixer 36 combines pilot and voice signals, both at the IF level. Since both have undergone the same Doppler frequency spreading, and since the pilot signal and the voice signal are close in frequency at the radio frequency (RF) level, there is insignificant delay dispersion between those components. Therefore, the mixing operation translates the voice band signals to the baseband audio frequency level by the frequency subtraction inherent in mixing and, in the mixing process, cancels out any like frequency deviations such as those due to the rapid Doppler frequency spreading. Thus, the phase correction of the voice information component for the Doppler effects is complete. The output of mixer 36 is coupled through a low-pass filter 37 to an input a of a fast fade, gain correction circuit 38. Filter 37 is an RF blocking filter, and so has a cut-off frequency selected at any convenient frequency between the IF and the audio so that it passes only the low sidebands, i.e., essentially only the baseband frequencies of the mixer 36 output.

The derived envelope of the pilot is an indicator of the Rayleigh fast fading effect and various slow fading effects. The output of detector 33 is coupled through a low-pass filter 39 to the amplifier 13 for use in the usual manner for AGC to correct for slow amplitude changes. For this purpose, the filter 39 has a cut-off frequency of about 5 Hz. That slow AGC advantageously has the effect of setting the average value of the output of detector 33 at approximately one volt. The same output of detector 33 is also applied through a limiter 35 as a second input b signal to the gain correction circuit 38 to correct for undesired fast amplitude changes. Limiter 35 is set to limit negative-going signal excursions to a value equal to the product of a predetermined constant, advantageously 0.1, times that envelope average value, illustratively one volt, for a reason to be discussed.

In the circuit 38, the phase-corrected voice information signals are advantageously divided by a factor including the limited envelope detector output. That factor signal advantageously has substantially the same delay as the delay in the signals which are coupled through the mixer 36 to the first input of the gain correction circuit 38. The low-pass filter 37 is simply an RF block and has negligible delay effects at baseband. The analog division in the circuit 38 of the two input signals supplied thereto, with the same fast fading effects being time aligned with one another because of the aforementioned delay matching, accomplishes a cancellation of those fast fading effects. The aforementioned factor signal, i.e., limiter 35 output, which is applied to the b input of the gain correction circuit 38 is advantageously the larger of a value $\leftarrow$, which is equal to the aforementioned negative-going limiter value, i.e., 0.1 times 1 volt, or a value which is the instantaneous value of the envelope detector output. Accomplishing the division in this fashion prevents the divisor b from going close to zero when the instantaneous value of the detector 33 output goes close to zero (as sometimes happens in deep Rayleigh fading environments). Absent the limiting value $\leftarrow$, such an event would cause the correction circuit gain to become extremely large. If the pilot envelope, but not the audio envelope, value had faded to a level somewhat less than that corresponding to $\leftarrow$, due to decorrelating effects such as frequency selective fading, it would have introduced annoying bursts of excessive signal in the receiver audio output. Even in the theoretical absence of the slight decorrelation between voice and pilot fading envelopes, the $\leftarrow$ limit is necessary to limit the burst effect on noise and interference during fades.

Many circuit arrangements are commercially available for implementing the gain correction circuit 38. One of these is the analog division circuit illustrated in FIG. 25 at page 8-411 of the *Motorola* "Linear Integrated Circuits Data Book", 3rd edition, November, 1973. This circuit includes basically an analog multiplier 44, as represented, for example, by the Motorola integrated circuit chip MC15951, connected to receive the aforementioned a and b inputs to the gain correction circuit 38. The multiplier output is connected to the input of an operational amplifier 45, such as the Motorola integrated circuit amplifier chip MC1741G, which also receives the output of filter 37. That amplifier output is fed back to an input of the multiplier and is also the c output of the gain correction circuit 38 indicated in the drawing. Additional connections are provided as in that FIG. 25 to complete the division circuit.

The c output of the gain correction circuit 38 is the gain-corrected information signal and is coupled to an expander 40 through an audio bandpass filter 41. Expander 40 amplifies larger amplitude signals to a greater extent than lower amplitude signals. A transducer, such as a loudspeaker 42, receives the expander output. Filter 41 takes the 300-Hz through 3000-Hz voice band and blocks out residual pilot frequency components adjacent to that band, as well as any other adjacent distortion product frequencies that may have appeared as a result of the various processing operations noted in the receiver of FIG. 1. Although filter 41 can be located in the expander output, it is here preferred that it be in the input to eliminate various unwanted signal portions prior to expansion.

One useful expander is, e.g., the expander portion of the Signetics compandor NE570/I(I). In the Signetics June, 1977, brochure entitled "Compandor NE570/I Monolithic Dual Compressor/Expandor", pp. 8–13 describe an expander which is advantageously utilized for implementing expander 40 in accordance with the illustrative embodiment of the present invention. Such expander includes circuit functions corresponding to those of a rectifier, a variable gain cell, and an amplifier. It has a terminal typically designated Rect Cap, in addition to an output terminal, and to which an external capacitor is connectable as described in that brochure and hereinafter in regard to FIG. 3. Signals appearing at the terminal Rect Cap include a direct current level signal having a magnitude which is a function of the audio signal level at the expander input. That level is low when the received voice signal is low, e.g., during intersyllabic quiet intervals of speech; and it is higher at other times. That Rect Cap output, appearing on a lead 43 in FIG. 1 of the present application, is coupled through an amplifier 46 to the limiter 35.

Figure 2:
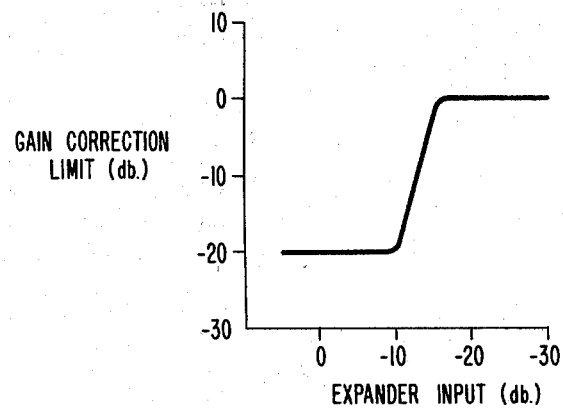
FIG. 2 is a diagram illustrating the operating characteristic of an expander and amplifier utilized in the aforementioned receiver.

Amplifier 46 is designed to present a substantially constant high signal output for low voice signal levels, i.e., those corresponding to relatively quiet times between active speech syllables and a substantially constant low signal output for higher voice signal levels, i.e., those corresponding to intelligible speech. The two constant regions are joined by a region of finite slope to prevent a sharp transition between the two level output conditions when the speech signal suddenly goes from speech to silence, or vice versa. A similar characteristic for Gain Correction Limit vs. Expander Input is shown in FIG. 2 and will be subsequently discussed. An approximately vertical transition could cause sharp transitions and unwanted clicks in the audible output of the receiver.

In the limiter 35, the output of amplifier 46 is used to alter the negative-going signal limiting threshold of the limiter. In an illustrative embodiment, that threshold is increased by high outputs from amplifier 46 during intersyllabic quiet times; and it is allowed to decrease to its normal level by low outputs of amplifier 46 at other times. One result of this type of operation is that during an interval in which the received radio frequency signals experience a fade, and which interval coincides with part of an intersyllabic quiet interval, gain correction is at least partially inhibited; and the maximum available gain correction which can be effected in the correction circuit 38 is less than would otherwise be the case. The correction limit is set in a range to have a substantial suppressing effect on channel noise and interference occurring during the fade, but to have no more than a minimal volume reducing effect on perceived output volume of the receiver. A range of zero to minus 5 decibels (db) relative to the average pilot signal level has been found to produce satisfactory operation in the illustrative embodiment. In this circumstance, the correction signal coupled through the limiter 35 is unable to swing as far in a negative-going direction as it otherwise would during a deep fade in the absence of the low audio condition. Any simultaneous noise and cochannel interference appearing in the receiver-selected radio channel during the fade interval are less strongly amplified in circuit 38 and are thus less annoying, particularly after coupling through expander 40.

Considering now the condition of relatively high audio during a deep radio frequency fade, the smallest limiting value on the gain correction is utilized in limiter 35 so that the maximum correction is available during the radio frequency fade. Simultaneous noise and cochannel interference are correspondingly enhanced by any correction, but their effect is merged into the desired channel voice signal and is less annoying to listeners at high audio times than during the intersyllabic quiet times previously mentioned. In the absence of a deep radio frequency fade, the pilot signal exercises a normal gain correcting effect which overrides the effect of limiter 35.

Figure 3:
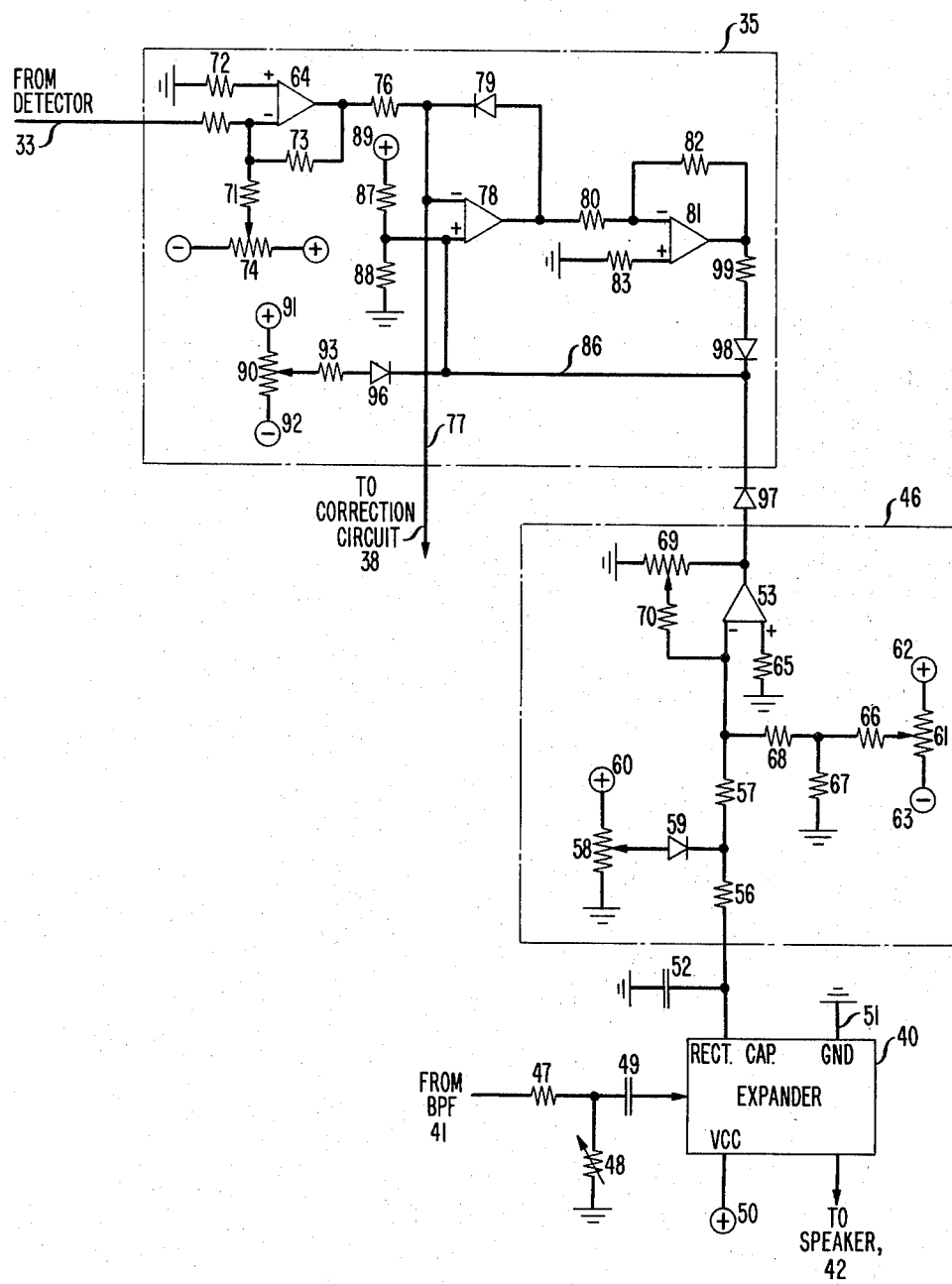
FIG. 3 is a schematic diagram illustrating an implementation of the invention in a portion of the receiver of FIG. 1.

FIG. 3 illustrates schematic detail of the limiter 35, the amplifier 46, and external circuits associated with expander 40 to show a preferred way to control the gain correction limit in response to receiver audio signal level. In the drawing, several operational amplifiers are shown, but power supply connections therefor have been omitted in order to avoid undue complication of the drawing. These amplifiers are illustratively of either the well-known type 741 or the well-known type 536 available commercially from plural integrated circuit chip vendors; and each advantageously works, for example, on power supply connections of plus and minus 15 volts.

The expander 40 input signal from the audio bandpass filter 41 is applied through a resistive potential divider including a series resistor 47 and a variable resistor 48. Resistor 48 is connected in shunt to ground. A capacitor 49 couples the electric circuit terminal which is common to those two resistors to the input connections of both the rectifier portion and the variable gain cell portion typically included in expanders based on the NE570/I compander. This capacitor performs a direct current blocking function and introduces no significant errors for signal ranges represented in FIG. 2. A positive voltage supply 50 is referenced to ground and provides the $V_{cc}$ supply voltage for such an expander. A ground connection 51 is also supplied for the expander in the usual fashion. Within expander 40, the typical operation is equivalent to that of a circuit including an operational amplifier internal to the expander for amplifying the output of the aforementioned variable gain cell. The output of such an amplifier function supplies signal for application to the speaker 42 in FIG. 1.

A capacitor 52 is connected between ground and the Rect Cap terminal of the expander 40 and comprises the rectifier portion output filtering capacitor. Capacitor 52 determines the cutoff frequency of an otherwise internal los pass filter. In the equivalent expander circuit, the capacitor 52 is the shunt input capacitance of that low pass filter; and it receives the positive-going portions of the audio signal received by the expander. Output from that internal low pass filter is utilized as the gain control current for the internal variable gain cell of the expander. Thus, signals appearing across capacitor 52 include low-amplitude signals during intersyllabic quiet intervals and variably higher amplitudes at other times.

Signals appearing across capacitor 52 are applied to the input of the amplifier 46 which includes advantageously an operational amplifier 53 which is connected to operate as an inverting and limiting amplifier between expander 40 and limiter 35. Amplifier 53 is biased to provide between the audio signal input to expander 40 and the gain correction limiting function in limiter 35 a transfer characteristic of the aforementioned type illustrated in FIG. 2. In that figure, the gain correction limit is indicated with reference to the aforementioned envelope average value goal, i.e., one volt, for the output of detector 33. The expander input is shown with reference to the average level of an assumed talker, i.e., a desired average input. In that characteristic, and considering illustrative numerical cases, gain correction limit values in the range between +10 and −30 db relative to an average pilot signal level of one volt are plotted against expander inputs of between +10 and −30 db relative to a predetermined average talker audio signal level at that input. Thus, for normal speech in the range of expander inputs between plus and minus 10 db, the lowest gain correction limit is in effect to prevent greater gain correction than that corresponding to a pilot envelope negative-going swing of about −20 db. For lower speech levels, e.g., about −15 db and lower, the highest illustrated gain correction limit is in effect to prevent greater correction than that corresponding to the average pilot envelope level of about 0 db. For the illustrative embodiment, limit values of zero to −5 db for this upper plateau have been found to provide adequate noise and interference suppression without appreciably affecting receiver output volume. For intermediate speech levels, i.e., between −10 db and −15 db, the transfer characteristic has a positive nonvertical slope determined by the setting of potentiometer 69 which controls the gain of amplifier 53. However, since that intermediate range is at the lower threshold of useful audio signal amplitudes, it will be appreciated that audio signal conditions will usually pass rapidly through the indicated expander input signal intermediate range at the beginnings and endings of syllables.

Series connected resistors 56 and 57 couple the Rect Cap terminal of expander 40 to the inverting input connection of amplifier 53. The common series terminal for those two resistors is biased from a tap on a potential dividing resistor 58 through a diode 59 that is poled for forward conduction of current from the adjustable tap on resistor 58 to the common terminal between resistors 56 and 57. A positive voltage supply 60 is referenced to ground and connected across the resistor 58. Resistances of each of resistors 56 and 57 are about two orders of magnitude larger than that of resistor 58. That potential divider diode 59 and resistor 56 are selected to fix the input signal for amplifier 53 at a first predetermined minimum low level for all voice inputs below that corresponding to the expander input signal level of −15 db. Adjustment of the tap on potential dividing resistor 58 determines the expander input signal level at which the upper knee of the FIG. 2 characteristic occurs. This also affects the upper plateau of the characteristic.

Input signals to the expander which are larger than those corresponding to the mentioned minimum cause the output at the Rect Cap terminal to block diode 59 and increase bias otherwise supplied to the inverting input of amplifier 53 from another potential dividing resistor 61 connected between ground-referenced positive and negative supplies 62 and 63, and by way of additional coupling resistors 66, 67, and 68. Resistor 61 is about five times larger than resistor 58 and is connected across supplies of the same size as the supply potential for amplifier 53, i.e., about two and one-half times the voltage of supply 60. Adjustment of the tap on potential dividing resistor 61 adjusts the upper gain correction level of the FIG. 2 characteristic, as well as affecting the positions of both knees thereof. This allows the characteristic to be shifted to the right or left as shown in FIG. 2 to place the transition region at an expander input level corresponding approximately to the lowest useful speech level for the environment in which the receiver is to be used. Resistor 68 is of about the same size as resistor 57, resistor 66 about half that value, and resistor 67 about an order smaller than resistor 68.

Assuming that diode 97 is conducting during a signal fade, an increasing input bias to amplifier 53 during an inactive speech interval causes it to produce its lower output level; and diode 97 stops conducting. The slope of the transition between the upper and lower levels of operation of amplifier 53, and thus the gain of the amplifier, is fixed by adjustment of a potential dividing resistor 69 connected between ground and the output of amplifier 53, and a much larger resistor 70 connected between an adjustable tap on resistor 69 and the inverting input of amplifier 53. This slope is set, as previously noted, to have a nonvertical configuration so that the transition between the high and low levels does not occur so rapidly as to produce clicks in the audio output of the receiver. A resistor 65 connects the noninverting input to ground. Resistor 70 is about an order larger than resistor 68, and resistor 69 is about twenty times larger than resistor 65. It will be appreciated that adjustments of taps on resistors 58, 61, and 69 have interactive effects on the operation of amplifier 53 and on the shape of the FIG. 2 characteristic. Consequently, the adjustment of any one may require readjustment of one or more of the others to secure a desired characteristic.

Limiter 35 is a well-known operational amplifier type of clamp circuit. The particular embodiment thereof shown in FIG. 3 includes an input operational amplifier 64 connected as a buffer amplifier between the output of envelope detector 33 and the divisor input of gain correction circuit 38. A potential dividing resistor 74 is connected between ground-referenced positive and negative potential supplies and has its variable tap coupled through a resistor 71 to the inverting input of amplifier 64. Resistors 74 and 71 are provided for adjusting the offset of the buffer amplifier stage to be sure that the divisor input of circuit 38 is subjected to signals at levels which are the same as those appearing at the output of envelope detector 33. The noninverting input of amplifier 64 is coupled to ground through a resistor 72. A resistor 73 provides negative feedback for the amplifier to fix its gain at a level suitable to bring the detector output up to an appropriate level for use in the gain correction circuit 38.

A series resistor 76 couples the output of amplifier 69 to the divisor input of gain correction circuit 38 and has a resistance value selected to cause the impedance presented to the divisor input to be relatively high. That impedance relationship allows the buffer amplifier and the gain correction circuit to operate relatively independently without interaction that may either alter the amplifier offset adjustment or alter the limiting threshold of the limiter 35.

Connected to a lead 77 between resistor 76 and the correction circuit 38 is a two-stage version of the aforementioned operational amplifier clamping circuit. It includes a limiting-reference controlling feedback. Two stages are employed to assure the capability for operation with a sharp and fast limiting effect. The lead 77 end of resistor 76 is connected to the inverting input of a first operational amplifier 78 having a diode 79 coupled for forward current conduction from the amplifier output to its inverting input. Amplifier 78 and diode 79 clamp the lead 77 to be no more negative than the noninverting input to the amplifier. If lead 77 begins to be driven more negatively by amplifier 64, diode 79 conducts to provide the clamping action. If lead 77 is driven more positively than the clamping threshold, the output of amplifier 78 is driven in a negative-going direction to block diode 79 and remove the clamping action on lead 77.

The same output of amplifier 78 is coupled through a resistor 80 to the inverting input of a second amplifier 81 having a resistor 82 in its negative feedback connection. Resistors 80 and 82 have resistances selected to provide the necessary gain predetermined to be required for fast clamping action. The noninverting input of amplifier 81 is connected to ground through a resistor 83. A series combination of a resistor 99, a diode 98, and a lead 86 provides feedback from the output of amplifier 81 to the noninverting input of amplifier 78. That feedback limits the extent of negative-going excursions in the output of amplifier 78 and thereby assures fast recovery.

The noninverting input of amplifier 78 is provided with several biasing arrangements for the desired limiting function. Potential dividing resistors 87 and 88 are connected across the output of a positive voltage supply 89 to establish a coarse reference level for the limiter operation. Diode 96, diode 97, and diode 98 cooperate to clamp lead 86 to the greater value of the voltage at the adjustable tap of resistor 90, the voltage at the output of circuit 46, and the voltage at the output of amplifier 81. The setting of resistor 90 sets the lower limit of inputs to the correction circuit on lead 77 to 0.1 times average value previously discussed. Potential dividing resistor 90 is connected between a positive supply 91 and a negative supply 92, both referenced to ground, and has its adjustable tap coupled through a resistor 93 and diode 96 to the lead 86. Any tendency for the pilot envelope correction signal to draw lead 77 to a lower potential brings diode 79 into conduction to prevent such lower excursions.

Diode 97, coupled between amplifier 46 and the limiter feedback lead 86, is poled for forward conduction of current toward that lead. The aforementioned biasing arrangements within the amplifier 46 are selected so that any excursion of the audio input to expander 40 below the mentioned −15-db level causes the output of amplifier 53 to attain its uppermost output level, which is also higher than the previously described minimum level established for lead 36. That action blocks diode 96 and limits the potential of lead 86 to that higher level during fades, thereby correspondingly raising the reference noninverting input to amplifier 78. Thus, the maximum gain compensation that can be produced is forced to a lower amount during intervals of low audio signal level. The minimum possible negative-going excursion of lead 77 before diode 79 begins to conduct is likewise raised. Consequently, the negative-going output amplitude range of buffer amplifier 64 is more restricted when diode 97 is conducting; and the minimum divisor input to gain correction circuit 38 is increased so that less correction is available. As previously indicated, the last mentioned minimum corresponds to an approximately zero correction level in one embodiment. Thus, if a deep fade in the received channel signal should occur during an interval if intersyllabic quiet in the audio input to expander 40, channel noise is reproduced in the receiver output with less than its normal corrected amplitude. However, since the restricted gain correction capability prevails only during intersyllabic quiet times in speech, the receiver output volume is largely unaffected.

Although the invention has been described in connection with a particular embodiment thereof, it is to be understood that additional embodiments, applications, and modifications thereof, which will be obvious to those skilled in the art are included within the spirit and scope of the invention.

What is claimed is:

1. In a radio receiver for extracting audio signal information in a predetermined amplitude range, including speech signals, from a channel of received radio frequency signals, said audio signal information also including from time to time noise and cochannel interference, means, responsive to a part of said received signals, for adjusting the gain of said receiver to compensate for amplitude fading in said received signals, said adjusting means including means for limiting adjustments to be no more than a predetermined maximum amount.

means, responsive to compensated audio signals from said adjusting means, for producing a substantially constant high signal output for intersyllabic relatively quiet times and a substantially constant low signal output for active speech syllables, and means, responsive to an output of said producing means, for controlling operation of said limiting means to reduce said maximum amount during said intersyllabic quiet times in said speech signals.

2. The radio receiver in accordance with claim 1 in which said controlling means includes means for fixing said reduced maximum amount in a range between appreciable audio quiet time noise and interference suppression and minimal receiver output volume reduction at other times.

3. A moble radiotelephone receiver for extracting audio signal information from a channel of received radio frequency signals and including a pilot-controlled gain correction circuit with means for limiting the extent of correction during intervals of low channel gain, and further including means for indicating average audio signal envelope amplitude as that signal varies at a syllabic rate, the receiver being characterized in that there are provided means, responsive to said indicating means, for increasing the effect of said limiting means to reduce the extent of gain correction possible during intersyllabic quiet intervals of audio signal amplitude.

4. In a single sideband mobile radiotelephone receiver for extracting audio signal information from received radio frequency signals in a predetermined radio channel, said radio frequency signals being subject to varying degrees of fading, means, responsive to a pilot signal in said received signals, for correcting receiver gain for information signals in said received signals to compensate for said fading, means for limiting the extent of correction by said correcting means during intervals of low channel gain to a threshold that prevents annoying enhancement of channel noise occurring during fade intervals, means for indicating average envelope amplitude of said audio signal, after gain correction, as it varies at a syllabic rate in a predetermined amplitude range for active speech, and means, responsive to said indicating means, for increasing the limiting threshold of said limiting means during intervals of audio signal amplitude below said range.

5. The receiver in accordance with claim 4 in which said gain correcting means includes analog signal dividing means for dividing said audio information signal by the envelope of said pilot signal, said limiting means comprises means for limiting negative-going excursions of said pilot signal divisor to a predetermined minimum analog value ← , and said increasing means includes means for adjusting said minimum value ← .

6. The receiver in accordance with claim 5 in which said increasing means includes means for effecting a finite-slope transition between said predetermined minimum value and increased minimum value for ← during audio signal envelope transitions between active portions thereof and intersyllabic quiet portions thereof.

7. The receiver in accordance with claim 4 in which said limiting means comprises means for coupling said pilot signal to said gain correcting means, a limiter having a limiting-reference controlling feedback connection to limit signal excursions in said coupling means, and said increasing means includes means, responsive to an audio signal output level produced by said receiver, for overriding said controlling feedback to establish a higher reference.

8. The receiver in accordance with claim 7 in which said indicating means comprises a signal amplitude expander, responsive to an output of said gain correcting means, for producing said receiver audio signal output level, and means are provided for applying said audio signal output level to said controlling feedback.

9. In a single sideband mobile radiotelephone receiver of signals including at least a speech information signal component and a pilot signal component, a method for correcting receiver gain for deep fades in received channel signals without unduly enhancing channel noise and interference during a fade, said method comprising the steps of correcting receiver gain in response to said pilot signal in a predetermined radio channel, detecting intersyllabic quiet times in said speech information signal component, and applying results of said detecting step for at least partially inhibiting gain correction during said intersyllabic quiet times.

10. The method in accordance with claim 9 in which the inhibiting step comprises the step of controllably limiting fade-direction excursions of said pilot signal prior to application thereof to use in the gain correcting step.

11. The method in accordance with claim 9 in which said gain correcting step comprises dividing said information signal by said pilot signal envelope, and said inhibiting step comprises the steps of limiting fade-direction excursions of said pilot signal envelope, prior to application to use in said gain correcting step, to a first minimum level selected to prevent an audible burst in receiver audio output signals in response to channel noise occurring in coincidence with a deep fade, and limiting said fade-direction excursions, prior to application to use in said gain correcting step, to a second higher minimum level during intersyllabic quiet intervals in the receiver audio output.

12. In a radio receiver for extracting audio signal information from a channel of received radio frequency signals, means, responsive to a part of said received signals, for adjusting the gain of said receiver to compensate for amplitude distortion in said received signals, means in said adjusting means for limiting operation thereof to impose a maximum compensation limit, and means, responsive to said compensated audio signal information, from said adjusting means for controlling said adjusting means to force a reduced maximum compensation condition of operation during intersyllabic intervals of audio signal below a predetermined level.

13. In a radio receiver for deriving speech signals from received radio frequency signals, means, responsive to said received signals, for adjusting the gain of said receiver to maintain a predetermined gain level for voiced speech signals, means for detecting intersyllabic quiet times in said signals, and means, responsive to an output of said detecting means, for limiting operation of said adjusting means during said quiet times to allow less gain than is represented by said predetermined gain level and thereby suppress noise and interference in said quiet times.

* * * * *

UNITED STATES PATENT AND TRADEMARK OFFICE
CERTIFICATE OF CORRECTION

PATENT NO. : 4,403,348
DATED : September 6, 1983
INVENTOR(S) : Kenneth W. Leland et al.

It is certified that error appears in the above-identified patent and that said Letters Patent is hereby corrected as shown below:

Column 1, line 61, "attampts" should read -- attempts --.

Column 3, line 35, "If" should read -- IF --.

Column 4, line 57, "a", second occurrence, should read -- $\underline{a}$ --.

Column 5, line 6, "b" should read -- $\underline{b}$ --.

Column 5, line 26, "b" should read -- $\underline{b}$ --.

Column 7, line 60, "los" should read -- low --.

Column 10, line 59, "lead 36" should read -- lead 86 --.

Column 11, line 7, "if" should read -- of --.

Column 11, line 56, "characterized in that" should read
-- CHARACTERIZED IN THAT --.

Signed and Sealed this

Seventeenth Day of January 1984

[SEAL]

Attest:

GERALD J. MOSSINGHOFF

Attesting Officer

Commissioner of Patents and Trademarks